(12) United States Patent
Pribisic

(10) Patent No.: US 7,319,301 B2
(45) Date of Patent: Jan. 15, 2008

(54) DIFFERENTIAL ANTI-PINCH CAPACITIVE SENSOR

(75) Inventor: Mirko Pribisic, North York (CA)

(73) Assignee: Intier Automotive Closures Inc., Newmarket, Ontario (CA)

( * ) Notice: Subject to any disclaimer, the term of this patent is extended or adjusted under 35 U.S.C. 154(b) by 0 days.

(21) Appl. No.: 10/583,431

(22) PCT Filed: Dec. 17, 2004

(86) PCT No.: PCT/CA2004/002146

§ 371 (c)(1),
(2), (4) Date: Jun. 19, 2006

(87) PCT Pub. No.: WO2005/059285

PCT Pub. Date: Jun. 30, 2005

(65) Prior Publication Data

US 2007/0183182 A1 Aug. 9, 2007

(51) Int. Cl.
*B60J 1/17* (2006.01)
*G01L 1/14* (2006.01)

(52) U.S. Cl. ............... 318/468; 200/61.43; 49/27; 324/686; 73/780

(58) Field of Classification Search ............... 318/130, 318/434, 466–469; 49/26, 27; 73/763, 774, 73/780; 200/61.42, 61.43, 61.44; 324/658, 324/686

See application file for complete search history.

(56) References Cited

U.S. PATENT DOCUMENTS

| | | | | |
|---|---|---|---|---|
| 4,453,112 A | * | 6/1984 | Sauer et al. | 318/281 |
| 4,983,896 A | * | 1/1991 | Sugiyama et al. | 318/286 |
| 5,621,290 A | * | 4/1997 | Heller et al. | 318/466 |
| 6,377,009 B1 | | 4/2002 | Philipp | |

(Continued)

FOREIGN PATENT DOCUMENTS

DE 3513051 A1 10/1986

(Continued)

OTHER PUBLICATIONS

English Abstract of DE 4004353 A1.

(Continued)

*Primary Examiner*—Bentsu Ro
(74) *Attorney, Agent, or Firm*—Clark Hill PLC

(57) ABSTRACT

A proximity sensor for sensing an object in the path of or proximate to a closure panel such as a vehicle window. First and second electrodes encased in a non-conductive casing are mounted on the metallic structure near the closing edge of the aperture. The two electrodes define a capacitance CE1/2 therebetween, and parasitic capacitances CE1 and CE2 between the first electrode and chassis ground and the second electrode and chassis ground, respectively. A controller cyclically connects (1) the second electrode to a voltage reference source ($V_{ref1}$) and the first electrode to chassis ground and (2) the second electrode to chassis ground and the first electrode to the reference capacitor, thereby periodically charging the capacitance CE1/2 and transferring the charge stored thereon to the reference capacitor whilst short-circuiting the parasitic capacitances. The charge on the reference capacitor, the time period required to charge the reference capacitor to a specified voltage, or a calculated value for CE1/2 are then compared against a reference value in order to derive an obstruction signal.

15 Claims, 4 Drawing Sheets

U.S. PATENT DOCUMENTS

| | | | |
|---|---|---|---|
| 6,472,835 B2 * | 10/2002 | Ogasawara | 318/266 |
| 6,700,393 B2 * | 3/2004 | Haag et al. | 324/674 |
| 6,750,624 B2 | 6/2004 | Haag et al. | |
| 6,782,759 B2 * | 8/2004 | Shank et al. | 73/780 |

FOREIGN PATENT DOCUMENTS

| | | |
|---|---|---|
| DE | 4036465 A1 | 5/1991 |
| DE | 4004353 A1 | 8/1991 |
| DE | 4416803 A1 | 11/1994 |
| WO | WO 00/44018 | 7/2000 |
| WO | WO 02/101929 | 12/2002 |

OTHER PUBLICATIONS

English Abstract of DE 4036465 A1.
English Abstract of DE 4416803 A1.
English Abstract of DE 3513051 A1.

* cited by examiner

DIFFERENTIAL ANTI-PINCH CAPACITIVE SENSOR

BACKGROUND OF THE INVENTION

1. Field of the Invention

The present invention relates to a proximity sensor. In particular, the invention relates to a non-contact strip sensor for identifying the presence of proximate objects from variations in an electric field.

2. Description of the Related Art

Proximity sensors are widely used in the automotive industry to automate the control of power accessories. For instance, proximity sensors are often used in power window controllers to detect the presence of obstructions in the window frame when a window panel is being directed to the closed position. Such sensors can also be used to detect the presence of obstructions in other types of automotive closures such as sunroofs, side doors, sliding doors, lift gates, and deck lids.

A variety of capacitor-based proximity sensors are known in the art. For example, U.S. Pat. No. 6,377,009 discloses a system for preventing the pinching or trapping of a foreign object by a closing panel (such as a window) through the use of a sensing electrode or plate. This electrode is a metal strip or wire which is embedded in a plastic or rubber molding strip placed behind a piece of fascia or other trim part. The metal strip or wire and the chassis of the vehicle collectively form the two plates of a sensing capacitor. A foreign object placed between these two electrodes changes the dielectric constant and thus varies the amount of charge stored by the sensing capacitor over a given period of time. The charge stored by the sensor capacitor is transferred to a reference capacitor in order to detect the presence of a foreign object. Similar capacitive sensing applications are known from DE 4036465A, DE 4416803A, DE 3513051A1, and DE 4004353A.

One of the problems with the known prior art capacitive sensing systems relates to the distance between the electrode (s) and the sheet metal or chassis ground of the automobile, which is in relative close proximity to the sensor electrode (s). Each of these systems incorporates a large background capacitance into the measurement. For example, in the U.S. Pat. No. 6,377,009 reference, the electrode may be only 5-8 mm away from the sheet metal of the automobile. Accordingly, it becomes relatively more difficult to sense small objects near the electrode because of the dominance of the background capacitance, and special measures have to be taken to filter out or eliminate this capacitance from the decision-making process.

SUMMARY OF THE INVENTION

According to one aspect of the invention, a proximity sensor is provided which is mountable adjacent to an aperture of a metallic motor vehicle for determining the presence of an object in the path of or proximate to a closure panel that moves between a fully open position and a closed position. The sensor includes first and second switches encased in a non-conductive casing mountable on the vehicle. The two electrodes define a capacitance of CE1/2 therebetween, a parasitic capacitance CE1/2 between the first electrode and chassis ground, and a parasitic capacitance CE2 between the second electrode and chassis ground. A first switch selectively connects the first electrode to a reference capacitor (C1) or to chassis ground and a second switch selectively connects the second electrode to a first voltage reference source ($V_{ref1}$) or to chassis ground. The first and second switches are controlled in order to periodically charge the capacitance CE1/2 and transfer the charge stored thereon to the reference capacitor without transferring substantially any charge stored on the capacitances CE1 and CE2 to the reference capacitor. As described in great detail below, this is made possible because the sensor circuit essentially short-circuits the parasitic capacitances during the charge transfer cycle.

The reference capacitor (C1) preferably forms part of a charge integrator circuit connectable to the first switch. More particularly, the first switch is connected to the negative input terminal of the integrator, the positive input terminal being grounded.

An obstruction may be sensed by transferring charge from the sensing capacitance CE1/2 to the reference capacitor for a fixed number of cycles and then comparing the measured capacitance against a baseline reference. Alternatively, the number of cycles required to charge the reference capacitor (over a fixed time period) until it reaches a predetermined voltage level can be measured and compared against a baseline reference.

According to another aspect of the invention, a method is provided for sensing the presence of an object in the path of or proximate to a closure panel, mounted in a metallic structure, that moves in an aperture between a fully open position and a closed position. The method includes mounting first and second electrodes encased in a non-conductive casing on the structure near the closing edge of the aperture. The two electrodes define a capacitance CE1/2 therebetween, a parasitic capacitance CE1 between the first electrode and chassis ground, and a parasitic capacitance CE2 between the second electrode and chassis ground. The method includes cyclically connecting (a) the second electrode to a voltage reference source ($V_{ref1}$) and the first electrode to chassis ground, and (b) the second electrode to chassis ground and the first electrode to the reference capacitor. This periodically charges the capacitance CE1/2 and transfers the charge stored thereon to the reference capacitor whilst short-circuiting the parasitic capacitances. Then, the charge on the reference capacitor, the time period required to charge the reference capacitor to a specified voltage, or a calculated value for CE1/2 can be compared against a reference value in order to derive an obstruction signal.

BRIEF DESCRIPTION OF THE DRAWINGS

The foregoing and other aspects of the invention will be better understood from the following detailed description of preferred embodiments of the invention in conjunction with the drawings thereof, wherein.

DETAILED DESCRIPTION OF THE PREFERRED EMBODIMENTS

Figure 1:
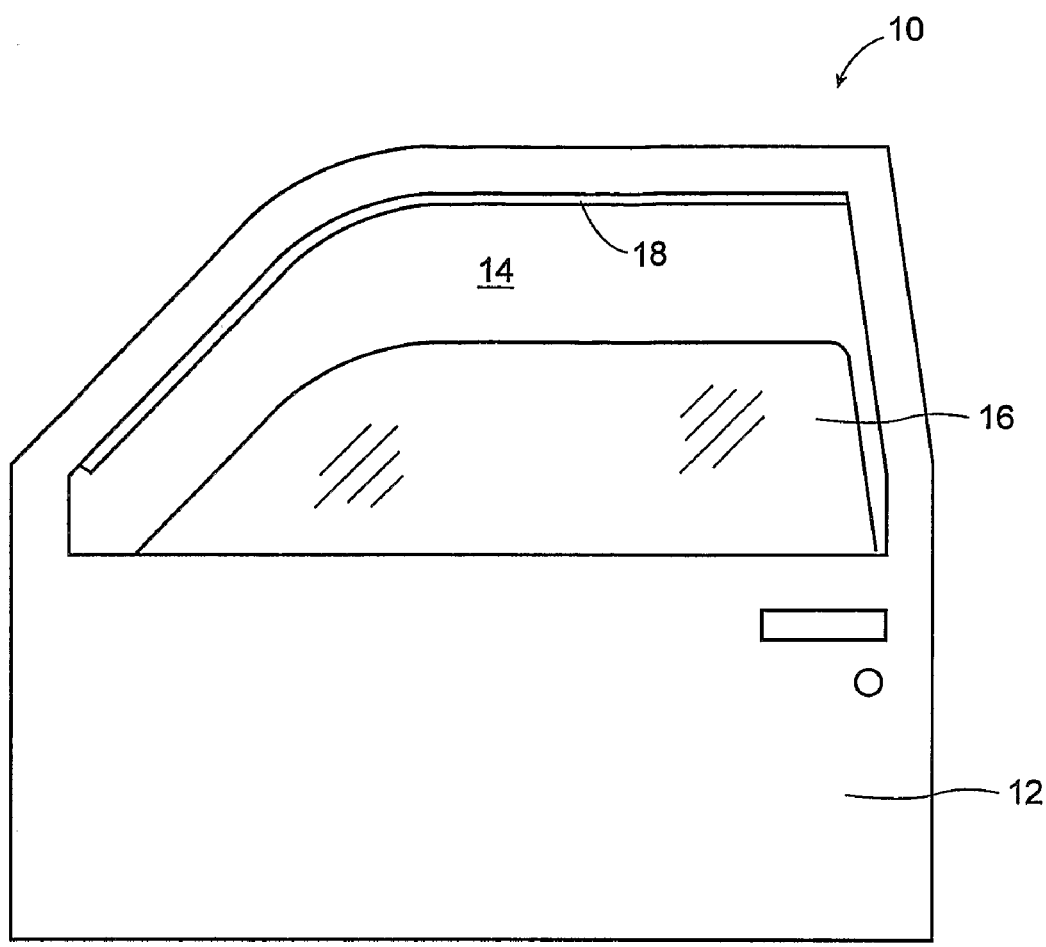
FIG. 1 is a diagram of an automotive door having a non-contact obstruction sensor mounted thereto.

FIG. 1 illustrates a typical automotive door 12 that is comprised of sheet metal and includes an aperture 14, structured as a window frame 40, which may be closed by a window pane or glass panel 16. The glass panel 16 is raised or lowered by a window regulator (not shown) which includes an electric motor 52 (see FIG. 3) as the motive driving source, as well known in the art, per se. The motor 52 is controlled in part by a non-contact obstruction sensor or anti-pinch assembly 10, the particulars of which are described in greater detail below. The anti-pinch assembly 10 prevents the glass panel 16 from pinching or crushing a foreign object such as a finger (not shown) that may be extending through the aperture 14 when the panel nears its closed position. It will be appreciated by those skilled in the art that the anti-pinch assembly 10 can be applied to any motorized or automated closure panel structure that moves between an open position and a closed position. For example, a non-exhaustive list of closure panels includes windowpanes, doors, lift gates, sunroofs, and the like. For ease of description, the remainder of this disclosure will focus on the windowpane and window frame combination.

Figure 2:
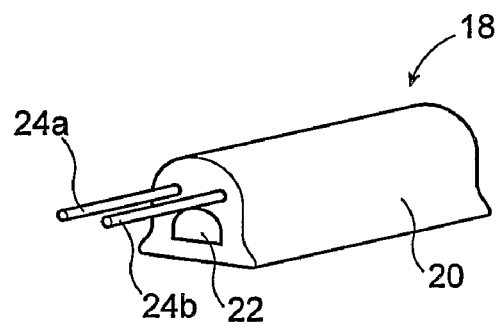
FIG. 2 is a fragmentary perspective view of a trim piece which contains embedded strip electrodes according for use with the obstruction sensor according to one embodiment of the invention.
Figure 5:
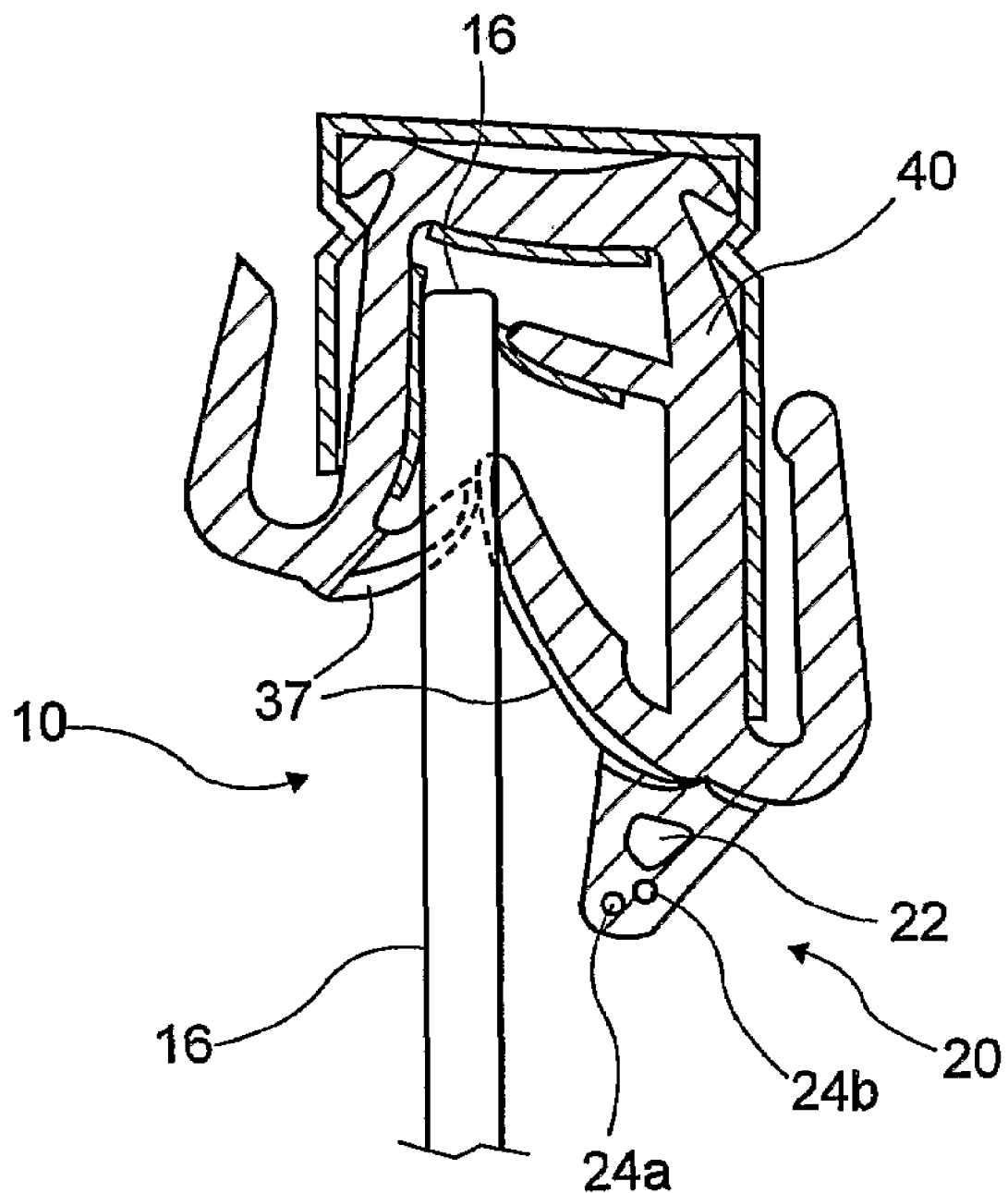
FIG. 5 is a cross-sectional view of a window frame sealing system incorporating embedded electrodes for use with the obstruction sensor, according to a preferred embodiment of the invention.

The anti-pinch assembly 10 includes two strip electrodes 24a and 24b such as wires that are preferably embedded in a non-conductive casing 18 mounted near or on the upper part of window frame 40. As shown in FIG. 2, the casing 18 is preferably formed from an oblong elastomeric trim piece 20 that has an integrally formed cavity 22. The cavity 22 enables the trim piece 20 to more readily deform, thus enabling the distance or space between the two electrodes 24a and 24b to be more readily altered. The trim piece 20 can be part of the window water sealing system, i.e., form part of a seal, or can form part of the decorative fascia of the vehicle. FIG. 5 shows a preferred embodiment of the trim piece 20 which forms part of a sealing system 37 of the window frame 40. The sealing system 37 is preferably formed from a flexible, and/or low durometer compound, in a range of less than 40 to 50 short. The flexibility of the sealing system 37 can also be controlled by the cross-sectional configuration, including controlling the thickness of the arms and walls supporting the electrodes. In the embodiment illustrated in FIG. 5, the electrodes 24a and 24b are molded directly into the sealing system 37.

Figure 3:
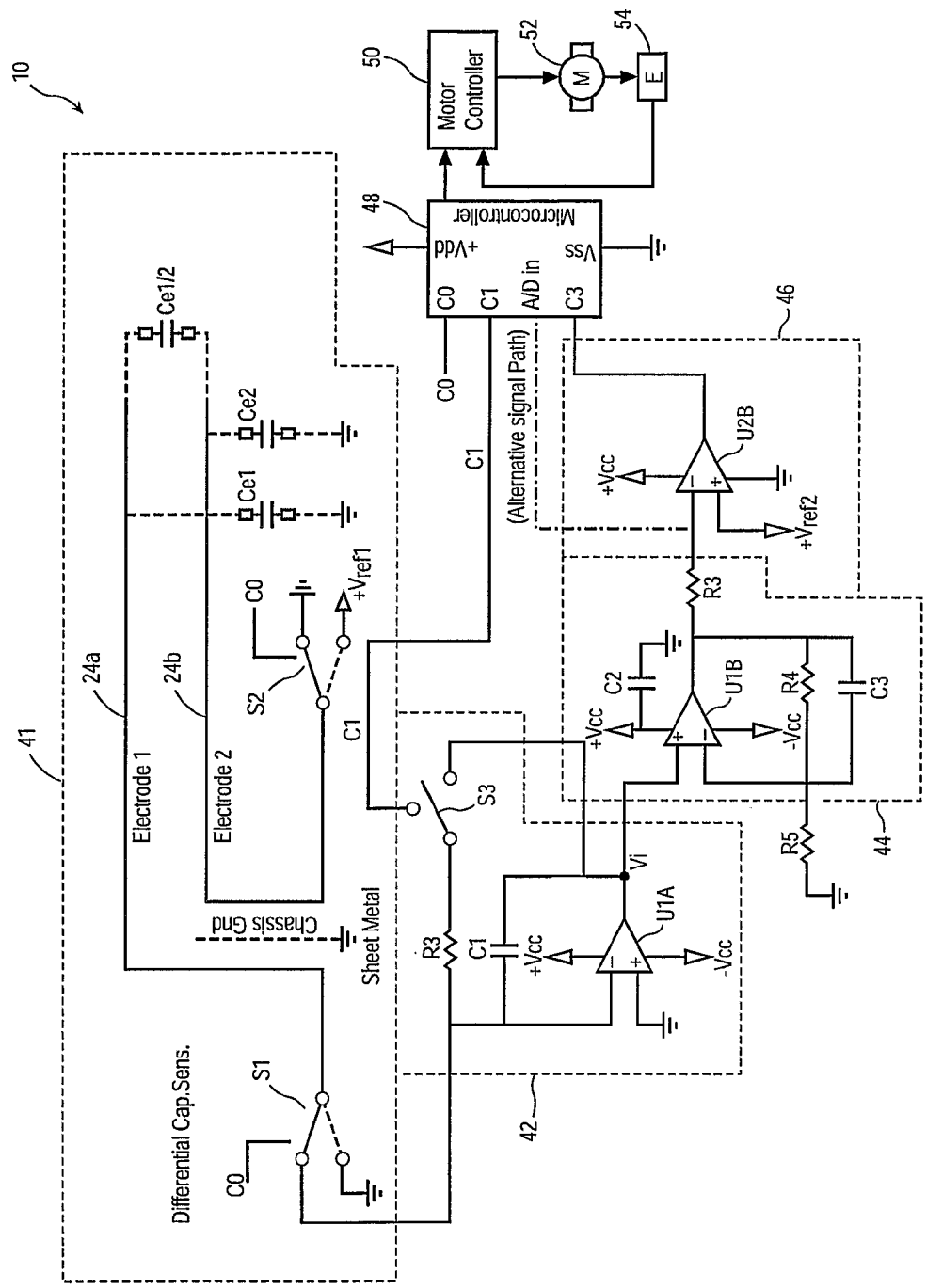
FIG. 3 is a circuit diagram of a non-contact obstruction sensor according to a preferred embodiment of the invention.

Referring additionally to the circuit diagram of FIG. 3, note that a capacitance CE1/2 exists between the two electrodes 24a and 24b. In addition, a capacitance CE1 exists between electrode 24a and the chassis ground of the vehicle, presented by the sheet metal 12. A second capacitance CE2 likewise exists between electrode 24b and the chassis ground.

The sensor circuit shown in FIG. 3 comprises the following major components:
- charging circuitry 41 for charging the electrodes 24a and 24b, including switches S1 and S2 and a voltage reference source $V_{ref1}$;
- a charge integrator 42, including an analog integrator U1A, capacitor C1, and a switch S3 for enabling the integrator 42 to be reset;
- a signal amplifier 44, comprising op amp U1B; resistors R4, R5 and capacitor C3;
- a signal convertor 46, comprising comparator U2B; and
- a micro-controller 48.

The micro-controller 48 is programmed to control the period of time that the electrode capacitances are charged and provides two control signals C0 and C1 that control the state of switches S1 and S2. Referring additionally to the waveform diagrams of FIG. 4, in an initial state, $t_0$, switch S1 is connected to the chassis ground and switch S2 is connected to the voltage reference source, $V_{ref1}$, as shown in stippled lines in FIG. 3. Consequently, electrode 24b is connected to the voltage reference source $V_{ref1}$ and electrode 24a is connected to the chassis ground. Hence, the capacitance between the second electrode 24b to ground, CE2, charges to the level of the reference voltage $V_{ref1}$, and the mutual capacitance CE1/2 between electrodes 24a and 24b is charged to the level of $V_{ref1}$. The capacitance of electrode 24a to ground, CE1, does not have any influence because the electrode 24a is grounded, thus short-circuiting CE1.

To start the measurement operation, the micro-controller 48 first resets the charge integrator 42. This is accomplished by setting control signal C1 to close switch S3 for a predetermined period of time in order to essentially short the pins of the op amp composing integrator 42, thus discharging capacitor C1 through the grounded op amp input. Note that resistor R3 is provided to limit the discharge current flow of capacitor C1.

After a suitable time period required to reset the charge integrator 42 (typically<5 ms), the micro-controller 48 toggles control signal C1 at time $t_1$ in order to open switch S3. At the same time, the micro-controller 48 toggles control signal C0 in order to flip switches S1 and S2 to the position shown in solid lines in FIG. 3. This causes electrode 24b to be connected to chassis ground and electrode 24a to be connected to the negative input of op amp U1A. In the previous time period (between $t_0$ and $t_1$), no charge was stored on CE1 so it does not contribute any signal to U1A. In addition, with switch S2 connected to ground, the parasitic background capacitance CE2 is short circuited and thus the charge stored thereon is discharged via switch S2 to ground without contributing any signal to U1A. Accordingly, the parasitic capacitance induced by the sheet metal of the vehicle is not measured. However, the capacitance CE1/2 between the two electrodes 24a, 24b will be received by the integrator 42. This is because the charged side of capacitance CE1/2 is now connected to GND via switch S2 causing the polarity of the capacitance to reverse and forcing the other side of CE1/2 to got to $-V_{ref1}$ in a transitional period. A negative current flows to the negative input of UA1, forcing the integrator output to become positive and accumulate the same quantum of charge held by CE1/2.

At time $t_2$, the micro-controller 48 toggles control signal C0 in order to flip switches S1 and S2 to the position shown in stippled lines in FIG. 3, following which electrode 24b is connected to the voltage reference source $V_{ref1}$ and electrode 24a is connected to the chassis ground. During this time period, the capacitance of electrode 24a to ground, CE1, does not have any influence because the electrode 24a is shorted to ground. In contrast, the capacitance between the second electrode 24b to ground, CE2, charges to the level of the reference voltage $V_{ref1}$, and the mutual capacitance CE1/2 between electrodes 24a and 24b is charged to the level of $V_{ref1}$.

Figure 4:
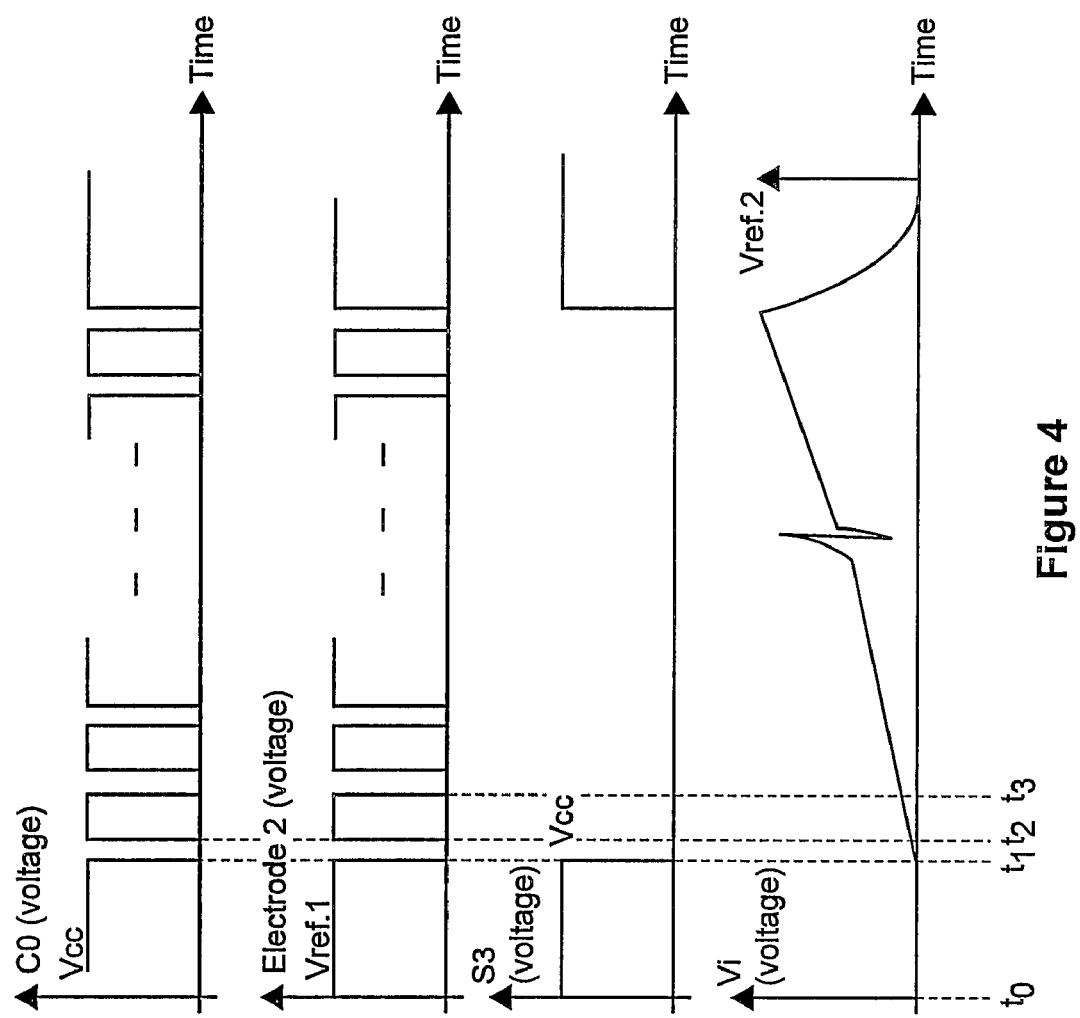
FIG. 4 is a timing diagram showing the waveforms of various signals present in the circuit shown in FIG. 3.

Shortly thereafter, at time $t_3$, the micro-controller 48 toggles control signal $C_0$ in order to flip switches S1 and S2 to the position shown in solid lines in FIG. 3. As previously described, the charge held on capacitor CE1/2 is injected into capacitor C1, which is significantly larger than CE1/2. The charge held by CE2 is not measured, as previously described. The process of transferring charge from capacitor CE1/2 to capacitor C1 of integrator 42 is continued in a pulsed manner as shown in FIG. 4. The process continues until signal Vi, which represents the charge stored on capacitor C1, reaches a voltage level equal to a second voltage reference, $V_{ref2}$. The comparator 46 can be used for this comparison, or alternatively, if the micro-controller has an analog-to-digital input, the micro-controller can execute this function directly. The number of pulses, N, required for Vi to reach $V_{ref2}$ is recorded by the micro-controller 48. Consequently, the measured capacitance of CE1/2 can be calculated as:

$$CE1/2 = (C1 * V_{ref2})/(N * V_{ref1})$$

In practice, the number of charge and discharge cycles, N, required to charge capacitor C1 to the second voltage reference level, will vary depending upon the presence of a foreign object or not and/or ambient conditions. The nominal number of cycles $N_{nom}$ can be measured in known circumstances, and then compared with operational data to determine if an object is proximate to the electrodes or otherwise present in the aperture. If N increases above a predetermined threshold value, the micro-controller 48 signals a motor controller 50 to stop or reverse the window regulator motor 52.

Preferably, the sensor signal, being a measure of the capacitance CE1/2 or N, is measured before the window is actuated in order to establish a base level. The sensor signal is then calculated from that base level, i.e., signal=current level−base level. This compensates for shifts in capacitance caused by variations of temperature and humidity.

In preferred embodiments, the micro-controller is programmed to generate a reference map, which correlates the sensor signal with the varying position of the window panel, as determined by an encoder 54. This correlation can be carried out every time the window is actuated, thus filtering out ambient effects, such as atmospheric humidity or the presence of a water film that may exist on the glass pane, which may affect the dielectric constant between the two electrodes 24a and 24b. The technique also compensates for the wearing of the mechanical parts involved. Using this reference map, the sensor signal can be dynamically measured and the motor 52 stopped whenever the signal exceeds the reference value by a predetermined threshold for a given position of the window pane. The predetermined threshold may depend on the position of the window pane. For example, when the window is far from being closed, the threshold value may be quite large. As the window nears its closed position, the threshold value can be reduced in order to increase the sensitivity of the obstruction sensor. In this matter, the sensitivity of the sensor can be increased at a critical point to ensure that fingers are not pinched when the window closes. See WO 02/12669, the contents of which are incorporated herein by reference, for additional information regarding the manner in which a reference map may be employed to reduce the effects of varying ambient conditions.

Alternatively, because the trim piece 20 is capable of deforming, at some point as the windowpane approaches its closing position, the change in the capacitance of CE1/2 arising out of the movement of the electrodes 24a, 24b can be significantly larger than the effect arising from the mere proximity of a foreign object. In this case, it may be desirable to decrease the sensitivity of the obstruction sensor within a certain zone. See more particularly WO 03/038220, the contents of which are incorporated herein by reference, for additional information regarding this technique.

The preferred embodiments have been described with some particularity for the purposes of description. Those skilled in the art will understand that a number of variations and modifications may be made to the embodiments disclosed herein without departing from the spirit of the invention. For example, rather than measuring the number of charges and discharge cycles, N, required for the reference capacitor C1 to reach the level of the second voltage reference, N can be fixed such that the controller measures or calculates the capacitance of CE1/2, which can be used as a basis for controller the motor. Similarly, a variety of other modifications may be made without departing from the spirit of the invention.

What is claimed is:

1. A proximity sensor mountable adjacent to an aperture of a metallic motor vehicle for determining the presence of an object in the path of or proximate to a closure panel that moves between a fully open position and a closed position, the sensor comprising:

first and second electrodes encased in a non-conductive casing mountable on the vehicle, the two electrodes defining a capacitance CE1/2 therebetween;

a reference capacitor (C1);

a first switch for selectively connecting the first electrode to the reference capacitor or to chassis ground;

a second switch for selectively connecting the second electrode to a first voltage reference source ($V_{ref1}$) or to chassis ground;

a controller for controlling the first and second switches in order to periodically charge the capacitance CE1/2 and transfer the charge stored thereon to the reference capacitor.

2. A proximity sensor according to claim 1, wherein the controller transfers charge from the capacitance CE1/2 to the reference capacitor for a fixed number of periods for each charge and discharge cycle of the reference capacitor.

3. A proximity sensor according to claim 2, wherein the controller measures the voltage level of the reference capacitor.

4. A proximity sensor according to claim 2, wherein the controller calculates the value of capacitance CE1/2 according to the following formula:

$$CE1/2 = (C1 * V_{ref2})/(N * V_{ref1}).$$

5. A proximity sensor according to claim 1, wherein the controller transfers charge from the capacitance CE1/2 to the reference capacitor for a variable number of periods for each charge and discharge cycle of the reference capacitor.

6. A proximity sensor according to claim 5, wherein the controller records the number of periods, N, required to transfer charge from capacitance CE1/2 to the reference capacitor until it reaches a voltage equal to a second voltage reference ($V_{re2}$).

7. A proximity sensor according to claim 1, wherein the reference capacitor (C1) forms part of a charge integrator circuit connectable to the first switch.

8. A proximity sensor according to claim 7, wherein the integrator circuit includes a switch controllable by said controller in order to dissipate charge from the reference capacitor (C1).

9. A proximity sensor according to claim 8, including a signal amplifier connected between the charge integrator circuit and the controller.

10. A proximity sensor mountable adjacent to an aperture of a metallic motor vehicle for determining the presence of an object in the path of or proximate to a closure panel that moves between a fully open position and a closed position, the sensor comprising:

first and second electrodes encased in a non-conductive casing mountable on the vehicle, the two electrodes defining a capacitance CE1/2 therebetween, a capacitance CE1 between the first electrode and chassis ground, and a capacitance CE2 between the second electrode and chassis ground;

a reference capacitor (C1);

a first switch for selectively connecting the first electrode to the reference capacitor or to chassis ground;

a second switch for selectively connecting the second electrode to a first voltage reference source ($V_{ref1}$) or to chassis ground;

circuitry for controlling the first and second switches in order to periodically charge the capacitance CE1/2 and transfer the charge stored thereon to the reference capacitor without transferring substantially any charge stored on the capacitances CE1 and CE2 to the reference capacitor.

11. An anti-pinch assembly for a closure device of a motor vehicle, said assembly comprising:

a closure panel, supported by the motor vehicle, and moveable between a fully open position and a closed position;

a controller operatively connected to the closure panel for controlling the operation thereof, said controller including a proximity sensor mountable adjacent to an aperture of the vehicle for determining the presence of an object in the path of the closure panel, the sensor comprising:

first and second electrodes encased in a non-conductive casing mountable on the vehicle, the two electrodes defining a capacitance CE1/2 therebetween; a reference capacitor (C1), a first switch for selectively connecting the first electrode to the reference capacitor or to chassis ground, a second switch for selectively connecting the second electrode to a first voltage reference source ($V_{ref1}$) or to chassis ground, and circuitry for controlling the first and second switches in order to periodically charge the capacitance CE1/2 and transfer the charge stored thereon to the reference capacitor;

said sensor providing an obstruction signal to the controller for preventing the movement of the closure panel when an object is sensed in the closure path.

12. A method of sensing the presence of an object in the path of or proximate to a closure panel, mounted in a metallic structure that moves in an aperture between a fully open position and a closed position, the method including:

mounting first and second electrodes encased in a non-conductive casing on the structure near the closing edge of the aperture, whereby the two electrodes define a capacitance CE1/2 therebetween, a parasitic capacitance CE1 between the first electrode and chassis ground, and a parasitic capacitance CE2 between the second electrode and chassis ground;

provisioning a reference capacitor (C1);

cyclically connecting (a) the second electrode to a voltage reference source ($V_{ref1}$) and the first electrode to a chassis ground and (b) the second electrode to chassis ground and the first electrode to the reference capacitor, thereby periodically charging the capacitance CE1/2 and transferring the charge stored thereon to the reference capacitor whilst short-circuiting the parasitic capacitances; and comparing the charge on the reference capacitor, the time period required to charge the reference capacitor to a specified voltage, or a calculated value for CE1/2 against a reference value in order to derive an obstruction signal.

13. A sensing method according to claim 12, wherein the value of capacitance CE1/2 is calculated according to the following formula:

$$CE1/2 = (C1 * V_{C1})/(N * V_{ref1}),$$

wherein $V_{C1}$ is the voltage on the reference capacitor.

14. A sensing method according to claim 12, wherein the reference capacitor (C1) forms part of a charge integrator circuit connectable to the first electrode.

15. A proximity sensor according to claim 14, wherein the integrator circuit includes a switch in order to periodically dissipate charge from the reference capacitor (C1).

* * * * *